United States Patent [19]

O'Brien

[11] Patent Number: 5,550,841
[45] Date of Patent: Aug. 27, 1996

[54] METHOD FOR FAILURE ANALYSIS OF MEGACHIPS USING SCAN TECHNIQUES

[75] Inventor: Mark O'Brien, San Jose, Calif.

[73] Assignee: LSI Logic Corporation, Milpitas, Calif.

[21] Appl. No.: 181,520

[22] Filed: Jan. 12, 1994

[51] Int. Cl.⁶ ............................ G01R 31/28; G06F 11/30
[52] U.S. Cl. .................. 371/22.1; 371/22.3; 324/532
[58] Field of Search ......................... 371/22.1, 23, 22.3, 371/25.1, 27, 22.5, 26, 29.1; 364/579, 717, 571.04; 374/41; 395/183.09

[56] References Cited

U.S. PATENT DOCUMENTS

| 5,291,495 | 3/1994 | Udell | 371/22.3 |
| 5,331,570 | 7/1994 | Bershteyn | 371/22.1 |
| 5,430,736 | 7/1995 | Takeoka et al. | 371/23 |

OTHER PUBLICATIONS

LSI Logic, Chip–Level Full Scan Design Methodology Guide, Jan. 1992, pp. ii–D11.

Primary Examiner—Robert W. Beausoliel, Jr.
Assistant Examiner—Nadeem Iqbal
Attorney, Agent, or Firm—Poms, Smith, Lande & Rose

[57] ABSTRACT

Testing of a semiconductor integrated circuit is conducted by determining all paths leading to a failed location on a chip. Potentially faulty locations are then determined by finding faults which occurred at the same time the failing vector was scanned, and the intersection of the paths and the faulty locations form a smaller set of potentially faulty locations on the IC. Further testing of the nodes which are in this smaller set is performed until a single location or small portion of a chip may be visually inspected with little effort.

19 Claims, 2 Drawing Sheets

METHOD FOR FAILURE ANALYSIS OF MEGACHIPS USING SCAN TECHNIQUES

FIELD OF THE INVENTION

This invention relates to testing of semiconductor chips, and more particularly to analytical methods of isolating malfunctions on a chip.

BACKGROUND OF THE INVENTION

Testing and fault isolation in semiconductor integrated circuits (IC's) has traditionally required a visual scan of the potentially faulty locations on the chip. Probes are utilized after a visual scan has been performed on the chip using a microscope. Such a visual scan over large portions of a 75,000 to 100,000 gate IC chip is extremely tedious and time consuming, and the results cannot be guaranteed.

If an error arises in a circuit, it is often impossible to isolate the exact location of the malfunctioning element. Testing procedures which have been employed to test ICs include transmitting data through the circuit and reading data output from the circuit. One problem with this technique is that all gates may not be exercised properly. That is, a two input NAND gate having one input zero will always output a value of one regardless of the state of the other input. Thus the integrity of the entire chip cannot be easily evaluated because the multitude of internal states cannot be determined based solely on output signals from the IC.

Prior testing methods performed testing on the chip and, based on the output from the chip, a visual scan was performed back through all paths leading to an output location determined to be faulty during the testing. While some areas on the chip can be ruled out as not containing faults using these methods, evaluation of IC chips using visual techniques is still necessary over a large portion of the chip.

Improving the testing time required for IC chips requires isolation of the faults on a chip to as small an area as possible. The cause of the fault may then be quickly determined if a small enough area can be isolated. Ideally, a single location should be isolated so that the cause of the failure can be visually determined with little time or effort.

SUMMARY OF THE INVENTION

The present invention facilitates the location of a defective node on a very large semiconductor chip. In accordance with the present invention faulty locations on the chip are isolated by evaluating the validity of smaller and smaller locations on the chip.

The chip is initially evaluated using a scan path design technique which partitions the circuit into individual scan elements. During test mode, the scan elements shift data along the scan chain and a test pattern is shifted into the scan chain. If a failing bit exists, the failing bit in the scan chain is obtained from a datalog.

The datalog is a tool created for each chip which provides the status of an individual flip-flop and the time at which the status of the flip-flop occurred. Once an individual register is determined to be faulty, based on the datalog, that failing register is used as a stop point in a static analyzer. The static analyzer is then employed to provide a fan-in report which indicates all logic paths which lead to the failure. These potential failure paths form an initial set of faulty locations on the chip.

A test pattern generator is then utilized which establishes a scan path and a set of test vectors to test the scan path. When the test pattern created by the test pattern generator is run through the circuit, a second set of potential faults are capable of being detected. The intersection of the first and second sets of potential faults forms a subset of potential faults.

A test pattern generator is also employed to create scan vectors for the macrocells which contain the subset of potential faults. The test pattern generator must be instructed to create only one test vector per fault. If the number of faulty locations contained within the subset of potential faults is too large to create only one test vector per fault, the test pattern generator must be used to create test vectors which can further reduce the subset until one test vector per fault may be generated. The test vectors created by the test pattern generator are run through the circuit. Based on the results of this second set of tests, an exact pin location and fault can be ascertained.

Once this testing method has been employed and a single pin and fault located, the location may be visually inspected with a microscope and evaluated with a probe.

Other objects, features, and advantages of the present invention will become more apparent from a consideration of the following detailed description and from the accompanying drawings.

DESCRIPTION OF THE PREFERRED EMBODIMENT

Figure 1:
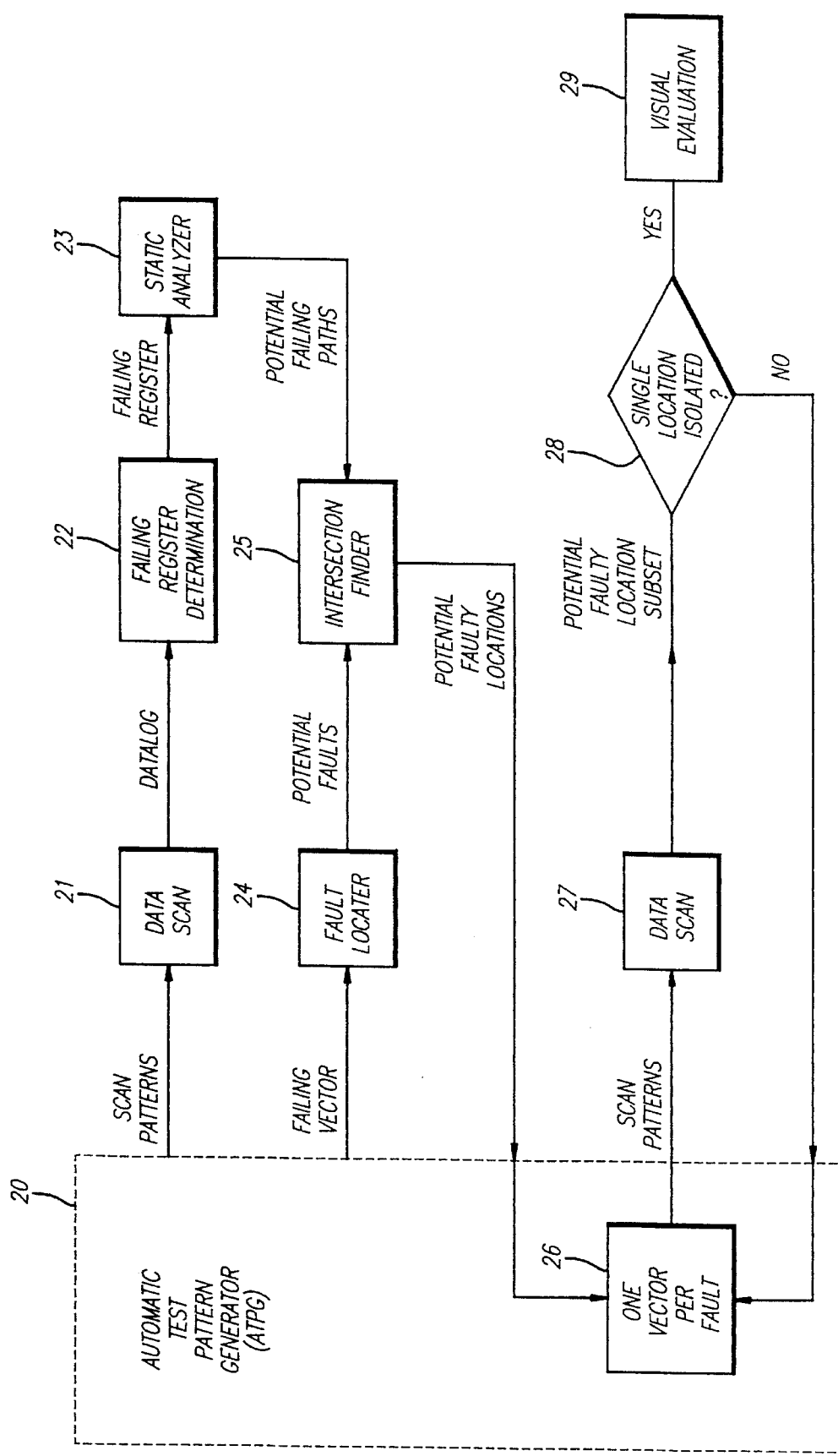
FIG. 1 is a block diagram of the method used to test an IC.

FIG. 1 graphically depicts the system of the present invention for analytically determining a faulty location on the chip. The basic testing principles used are known as scan testing, and are described in detail within *LSI Logic Chip-Level Full Scan Design Methodology Guide*, January 1992. The Automatic Test Pattern Generator (ATPG) 20 initially generates a set of test patterns based on the chip layout by modelling scan flip-flops and latches. ATPG 20 takes as inputs the various gates and connections on the circuit and creates test patterns which, when cycled through the chip, exercises all of the gates on the chip. For example, if a two input NAND gate is on the chip, and if one input to the gate were always zero, the output from the NAND gate would always be one. The ATPG 20 develops a scan pattern for the two input NAND gate such that both legs of the hypothetical two input NAND gate are exercised and evaluated for faults. If one leg is broken, the scan pattern generated by ATPG 20 will produce a fault status signal that is stored in a downstream flip-flop during scan pattern 21.

Data scan 21 requires partitioning the chip area into scan elements and establishing a scan chain and runs in both test mode and normal operational mode. Data scan 21 shifts data along a scan chain for the various scan elements, as is done in a shift register. A scan test pattern can be scanned, or shifted, into the scan chain. Data scan 21 fills all scan elements with data. When the circuit returns from test mode to its normal functional mode for one clock period, the test pattern generated by ATPG 20 and is in system flip-flops and applied at the primary inputs is processed by the chip circuitry. The results of the data scan 21 are stored to the system flip-flops by the single system clock pulse. When the circuit is next placed into test mode, the resulting scan pattern stored in the shift register is thus shifted out for comparison with the expected response.

In the scan path technique, system flip-flops are replaced by their scan equivalents. A flip-flop in data scan 21 operates as an ordinary flip-flop during the normal functional mode, but as part of a shift register during the test mode. Because test data is serially applied to the circuit, dedicated primary pins are needed to access all flip-flops within data scan 21.

Data scan 21 thus scans the entire chip based on the scan chains and scan elements set up, and produces a datalog. The datalog output from data scan 21 lists the time of the data scan, or clock cycle number, and the status of individual flip-flops. Scanned information that enters the flip-flop and output from the data scan 21 is available from the datalog for the flip-flops located on the scan chain.

Based on data scan status information in the datalog, and knowledge of chip architecture, the failing register determination step 22 finds the location of the failing register. Location of the failing register is then used as a stop point in static analyzer 23. Depending on where on the chip the datalog indicates the failure occurred, the static analyzer 23 traces the possible paths which lead to the failed register and generates a fan-in report. A fan-in report lists the logic paths leading to the failing register. Using the fault dictionary generated by the ATPG 20, the particular vector which caused the fault to develop may be located. Based on the vector which caused the failure, fault locater step 24 establishes a set of nodes which could have been bad. Fault locator step 24 indicates which nodes could have been observed by the vector which caused the failure in the data scan 21.

Based on the potential failing paths generated out of the static analyzer 21 and the potential faulty nodes determined from the failing vector output from fault locator step 24, the intersection of these two outputs can be determined using the intersection finder step 25. Intersection finder step 25 creates a subset of potential faulty locations.

The output from intersection finder step 25 is used to create a new scan pattern within ATPG 20. ATPG 20 goes through one vector per fault step 26, where based on the potential faulty locations on the chip, a single vector is generated to test each node. If one vector per fault step 26 cannot be accomplished, the number of vectors generated must be kept to a minimum to generate the smallest test pattern possible.

The second data scan 27 runs the scan patterns generated by one vector per fault step 26 within ATPG 20 tests these potentially faulty nodes to narrow the possible locations of the fault. The scan chain created within the second data scan 27 and the elements evaluated are particularized based on the locations of potential faults.

Output from second data scan 27 is a set of all potential faulty locations. This set of potential faulty locations is evaluated in single location evaluation step 28. If a single location has not been isolated, the ATPG 20 is instructed to repeat one vector per fault step 26 for all remaining faults which have been isolated by data scan 27. This loop continues until either testing is halted or a single location is discovered. If single location evaluation step 28 indicates that a single location has been isolated on the chip containing the fault, performance of a visual evaluation step 29 is required. Visual evaluation is performed using a microscope and a probe to determine the cause of the fault.

Figure 2:
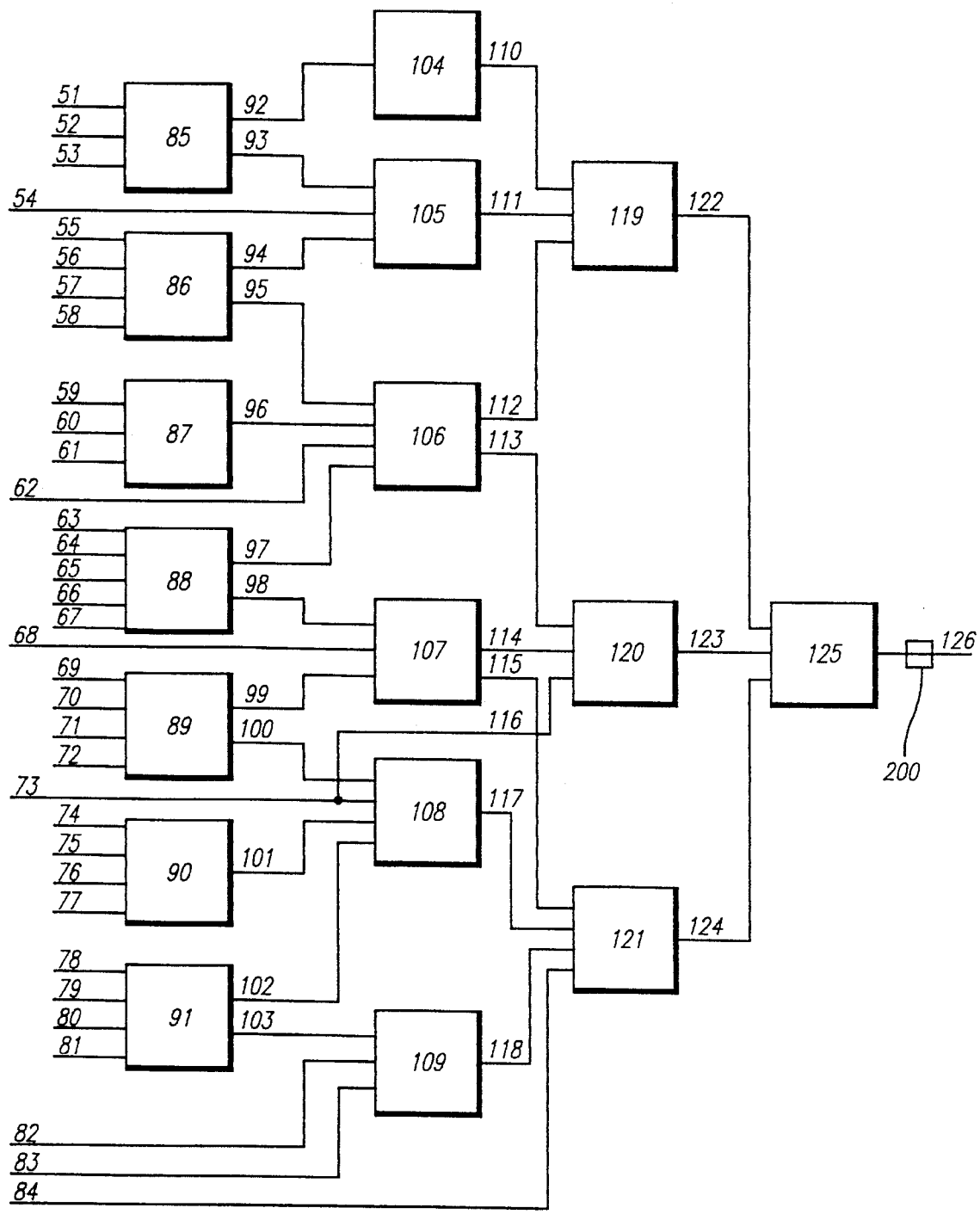
FIG. 2 is a circuit containing a plurality of gates, connections between the gates, and a faulty location.

FIG. 2 illustrates the design of a semiconductor chip, including the various inputs, gates, and connections between the elements. ATPG 20 receives the interconnections and elements shown in FIG. 2 and creates a scan pattern which is input through inputs 50–84. The scan pattern is run through data scan 21 which generates a datalog, listing the potentially faulty registers output from the device. Failing register determination step 22 then determines which register, if any, has failed. For example, failing register 200 illustrates a location where, from the datalog, a failure at a point in time can be determined to exist. Running the failing register 200 through static analyzer 23 indicates that any and all elements in FIG. 2, including inputs 50–84, gates 85–91, 104–109, 119–121, and 125, and connections 92–103, 110–118, 122–124, and 126, could be faulty.

To narrow down the potentially faulty location, the test pattern initially generated by ATPG 20 and the vector which failed data scan 21 are evaluated in fault locator step 24, which runs the individual vector through inputs 50–84. Based on the resulting outputs from the system, potential faulty locations on the chip may be determined. If inputs 50–72 were the only elements being exercised when the failing vector was used in data scan 21, then none of the gates or connections associated only with inputs 63–84 caused the failure observed. Thus gates 88–91 cannot be faulty, nor connections 97–103, etc. This process of narrowing down the potential faults in fault locator step 24 is then merged with the information received from the static analyzer 23 to narrow the potential faulty locations. Thus failing register 200 produces a set of all inputs, gates, and connections in FIG. 2 using the static analyzer 23, while intersection finding step 25 narrows the potential faulty locations to only those elements associated with inputs 50–62.

ATPG 20 then exercises one vector per fault step 26 for the potentially faulty locations. Exercise of the gates in the subset generated by intersection finding step 25 provides a narrower set of inputs that facilitates evaluation of the validity of the system. Based on the new set of scan patterns created by the ATPG 20, failing register 200 may pinpoint the exact location of the failure. If, for example, element 106 were exercised using only one vector per fault, and if exercise of element 106 caused a failure in failing register 200, then element 106 would be the faulty location.

The size of an IC chip or a failure to adequately narrow a potential subset of faulty locations by use of intersection finding step 25 may require use of more than one vector per fault to test the system in a reasonable amount of time. If a faulty single location or small set of faulty locations cannot be isolated using second data scan 27, then further narrowing may be used by instructing ATPG 20 to narrow the set of vectors to one vector per fault. Once the fault has been narrowed to a single location, such as gate 106, one may visually examine the faulty element to determine the cause of the fault.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A method of testing a semiconductor integrated circuit having a plurality of macrocells comprising the steps of:

establishing a circuit datalog having a plurality of status indicators and a plurality of time indicators;

determining a failing register from the plurality of status indicators and the plurality of time indicators;

selecting a plurality of logic paths on said semiconductor integrated circuit which lead to the failing register based on location of the failing register;

building a primary scan pattern for the semiconductor integrated circuit;

exercising said primary scan pattern and observing a first set of faults during exercise of the primary scan pattern which occurred at the same time as the failing register failed;

determining a set of potential failure megacells containing an intersection of the plurality of logic paths and the first set of faults;

recursively creating secondary scan patterns for the set of potential failure megacells;

recursively exercising said secondary scan patterns and observing a second set of faults which occurred at the same time as the failing register failed until a faulty location can be isolated; and visually scanning the faulty location to determine cause of failure.

2. The method of testing a semiconductor integrated circuit as defined in claim 1 wherein said step of establishing a circuit datalog consists of:

locating a status of an individual bit;

determining a time at which the status of the individual bit occurs; and listing the status and the time using an output device.

3. The method of testing a semiconductor integrated circuit as defined in claim 2 wherein said step of selecting a plurality of logic paths consists of:

using the failing register as a stop point in a static analyzer;

running the static analyzer to create a fan-in report indicating all logic paths leading to the failing register.

4. The method of testing a semiconductor integrated circuit as defined in claim 3 wherein said step of building a primary scan pattern consists of:

determining which gates are located on the semiconductor integrated circuit;

determining connections between said gates; and creating a set of inputs to said semiconductor integrated circuit such that when the set of inputs are received and transmitted through the circuit all paths of the circuit are exercised.

5. The method of testing a semiconductor integrated circuit as defined in claim 4 wherein said step of recursively creating secondary scan patterns consists of creating a plurality of vectors such that when the plurality of vectors is received and transmitted through the circuit all paths of the circuit are exercised, wherein one vector for each fault is created.

6. The method of testing a semiconductor integrated circuit as defined in claim 5 wherein said step of recursively exercising and observing consists of transmitting said plurality of vectors through the semiconductor and observing a first set of faults on the semiconductor.

7. The method of testing a semiconductor integrated circuit as defined in claim 6 wherein said visual scanning step consists of utilizing a microscope to examine the faulty location.

8. A method of testing a semiconductor integrated circuit having a plurality of macrocells comprising the steps of:

determining a failing register;

locating a set of paths on the semiconductor integrated circuit leading to the failing register;

creating a primary scan pattern;

exercising the primary scan pattern and observing a set of faults occurring when the failing register failed;

determining a set of megacells containing the set of paths and the set of faults;

repeatedly producing secondary scan patterns for evaluating the set of macrocells; and repeatedly exercising the second scan patterns until a faulty area can be located with the set of macrocells.

9. The method of testing a semiconductor integrated circuit as defined in claim 8 wherein said step of determining a failing register consists of:

performing a data scan;

locating a bit which failed the data scan;

determining a time at which the bit failed the data scan; and creating a datalog listing each bit and the time at which the bit was scanned.

10. The method of testing a semiconductor integrated circuit as defined in claim 9 wherein said step of locating a set of paths consists of:

using the failing register as a stop point in a static analyzer;

running the static analyzer to create a fan-in report indicating all logic paths leading to the failing register.

11. The method of testing a semiconductor integrated circuit as defined in claim 10 wherein said step of creating a primary scan pattern consists of:

determining which gates are located on the semiconductor integrated circuit;

determining connections between said gates; and creating a set of inputs to said semiconductor integrated circuit such that when the set of inputs are received and transmitted through the circuit all paths of the circuit are exercised.

12. The method of testing a semiconductor integrated circuit as defined in claim 11 wherein said step of repeatedly producing secondary scan patterns consists of creating a plurality of vectors such that when the plurality of vectors is received and transmitted through the circuit all paths of the circuit are exercised, wherein one vector for each fault is created.

13. The method of testing a semiconductor integrated circuit as defined in claim 12 wherein said step of repeatedly exercising the secondary scan patterns consists of transmitting said plurality of vectors through the semiconductor and observing faults on the semiconductor.

14. The method of testing a semiconductor integrated circuit as defined in claim 13 further comprising a visual scanning step of utilizing a microscope to examine the single location.

15. A method of testing a semiconductor integrated circuit having a plurality of macrocells comprising the steps of:

determining a set of physical paths located on the semiconductor which lead to a failing register;

exercising a primary scan pattern and observing a first set of faults on the semiconductor;

determining physical locations on the semiconductor of an intersection between the first set of faults and the set of physical paths;

iteratively determining and exercising secondary scan patterns to locate a small area containing the fault; and visually scanning the small area containing the fault to determine cause of failure.

16. The method of testing a semiconductor integrated circuit as defined in claim 15 wherein said step of determining a set of physical paths consists of:

performing a data scan;

locating a bit which failed the data scan;

determining a time at which the bit failed the data scan;

creating a datalog listing the bit which failed and the time at which the bit failed the data scan;

determining the failing register from the datalog based on location and time of failures; and tracing all potential paths on the semiconductor integrated circuit leading to the failing register.

17. The method of testing a semiconductor integrated circuit as defined in claim 16 wherein said step of determining the failing register from the datalog consists of:

using the failing register as a stop point in a static analyzer;

running the static analyzer to create a fan-in report indicating all logic paths leading to the failing register.

18. The method of testing a semiconductor integrated circuit as defined in claim 17 wherein said step of exercising a primary scan pattern consists of:

determining which gates are located on the semiconductor integrated circuit;

determining connections between said gates;

creating a set of inputs to said semiconductor integrated circuit such that when the set of inputs are received and transmitted through the circuit all paths of the circuit are exercised; and transmitting said set of inputs through the semiconductor and observing a first set of faults on the semiconductor.

19. The method of testing a semiconductor integrated circuit as defined in claim 18 wherein said visual scanning step consists of utilizing a microscope to examine the small area containing the fault.

* * * * *